United States Patent [19]

Bledsoe et al.

[11] 4,047,976

[45] Sept. 13, 1977

[54] METHOD FOR MANUFACTURING A HIGH-SPEED SEMICONDUCTOR DEVICE

[75] Inventors: Jerry L. Bledsoe, Phoenix; Clarence A. Lund, Mesa, both of Ariz.

[73] Assignee: Motorola, Inc., Chicago, Ill.

[21] Appl. No.: 698,444

[22] Filed: June 21, 1976

[51] Int. Cl.² .............................................. H01L 21/263
[52] U.S. Cl. ..................................... 148/1.5; 148/187; 357/91
[58] Field of Search .......................... 148/1.5; 357/91

[56] References Cited

U.S. PATENT DOCUMENTS

| | | | |
|---|---|---|---|
| 3,431,150 | 3/1969 | Dolan, Jr. et al. | 148/1.5 |
| 3,513,035 | 5/1970 | Fitzgerald et al. | 148/1.5 |
| 3,515,956 | 6/1970 | Martin et al. | 148/1.5 X |
| 3,824,133 | 7/1974 | D'Asaro et al. | 148/1.5 |
| 3,849,204 | 11/1974 | Fowler | 148/1.5 |

*Primary Examiner*—G. Ozaki
*Attorney, Agent, or Firm*—Lowell E. Clark

[57] ABSTRACT

A method for manufacturing high speed semiconductor devices by selectively reducing the minority carrier lifetime in regions susceptible to minority carrier charge storage. The selective reduction is achieved by implanting ions of low atomic weight into the surface of the semiconductor crystal in order to locally reduce the sub-surface lifetime.

6 Claims, No Drawings

METHOD FOR MANUFACTURING A HIGH-SPEED SEMICONDUCTOR DEVICE

BRIEF DESCRIPTION OF THE INVENTION

This invention relates to fabrication methods for high speed semiconductor switching devices and more particularly to high speed switching transistors, wherein optimum switching speeds are achieved by selectively reducing the lifetime in the collector regions.

In designing high speed switching transistor devices it is essential that the total switching speed which includes rise time, fall time, and carrier storage time, be reduced to an optimum minimum level for each selected operating voltage. The carrier storage time is the recovery time interval it takes for the carriers to be removed before switching the transistor off. In the on state, the junction between the collector and the base zone is traversed in the forward direction by current, which involves a strong injection or storage of charge carriers into the collector zone. Before turn-off can be achieved, these charge carriers must be removed.

The lifetime of the minority charge carriers may be reduced by adding given impurities to the semiconductor material. With germanium, iron, nickel, copper and gold can be used to reduce charge carrier lifetime. For silicon, gold may be used as described in U.S. Pat. No. 3,067,485 to D. F. Ciccolella et al, to reduce carrier lifetime in the semiconductor material. However, in order to obtain the high amplification or current gain, substantial lifetime of the minority charge carriers is required particularly in the base zone, so that it has been difficult to control the storage time of the transistor during the on and off state by means of diffusing within the transistor lifetime killers whose concentration is everywhere approximately the same. High concentrations of gold or other lifetime reducing impurities have been found to reduce the current gain of the transistors to unacceptable levels, especially when high concentration of such impurities are used in order to achieve very low storage times. Such lifetime reduction in the base region may be counteracted by reducing base width; however such reduction can impair the breakdown voltage of the transistor device. In addition, it has been found that gold and other lifetime killing impurities tend to concentrate at the surface of the semiconductor material. Ideally the lifetime should be minimized in the location of the lightly doped collector region which is typically several microns beneath the surface. Thus concentration of lifetime killing impurities at the surface tends to degrade the transistor current gain without achieving low values of collector region lifetime which are necessary in order to reduce storage time.

Lifetime killing impurities such as gold typically have a solubility in semiconductor which increases with temperature. In order to achieve the high concentration of the impurities which is required to reduce the minority carrier lifetimes very high diffusion temperatures must be used. In addition, in order to avoid precipitation of such impurities the devices must be cooled very rapidly or quenched in order to maintain high concentrations of the lifetime killing impurities in the semiconductor body. Thus it has been found very difficult to achieve extremely low storage times by the use of minority carrier lifetime killing elements such as gold.

In U.S. Pat. No. 3,165,811 to J. J. Kleimack et al the transistor structures shown and described wherein an epitaxial layer of high resistivity monocrystalline semiconductor material is grown on a low resistivity monocrystalline semiconductor substrate. Subsequently base and emitter regions are diffused into the epitaxially grown layer so as to form a transistor structure having a high resistivity collector region and a low resistivity subcollector region. A similar structure suitable for integrated circuit application is shown in U.S. Pat. No. 3,237,062 to Bernard T. Murphy. In this structure the lightly doped epitaxial collector region is grown on a heavily doped buried layer in a lightly doped substrate. In both the Kleimack and the Murphy structures, lifetime must be reduced in the lightly doped epitaxial collector regions without substantially impairing the lifetime in the base region and the portions of the emitter base junction which intersect the surface.

In this invention, it has been found that the requisite selective lifetime reduction may be achieved by damaging the subsurface regions of the semiconductor body with a high energy implantation of an ion of low atomic weight. This local damage is proportional to the number of ions stopped in the semiconductor. The concentration of the stopped species has a peak below the surface; the depth of the peak concentration increases with increasing energy of implantation and with reduced atomic weight of the implanted species. Thus ions of hydrogen, chlorine and fluorine to name a few are suitable for achieving localized subsurface damage. In addition to selective control of lifetime versus depth the ion implantation technique allows for control of lifetime across the area of the device by use of selective masking.

DETAILED DESCRIPTION

In discussing the device of this invention, the usual terminology that is well known in the transistor field will be used. In discussing concentrations, reference will be made to majority or minority carriers. By carriers is signified the free holes or electrons which are responsible for the passage of current through a semiconductor material. Majority carriers are used in reference to those carriers in preponderance in the material under discussion, i.e., holes in p-type material or electrons in n-type material. By use of the terminology minority carriers it is intended to signify those carriers in the minority, i.e., holes in n-type material or electrons in p-type material.

Although for the purpose of describing this invention reference will be made to an npn configuration wherein p-region is utilized as the base region, it is to be understood that such a structure is merely illustrative and that a pnp structure may also be suitably adapted to the purpose of this invention. Further, while the method of this invention is described with a special reference to transistor structures, it is understood that the techniques described are also applicable to other multijunction devices where selective control of lifetime is important. Bipolar transistor structures especially adapted to the practice of this invention have been disclosed in the patents to Kleimack et al and Murphy, cited above. Such transistor structures are commonly operated as switches having both an off and an on condition. In the off mode the collector base junction is reverse biased and the emitter base junction is zero biased or reverse biased. In this condition the transistor conducts only leakage current. To turn the transistor on, the emitter-base junction is forward biased, causing the collector voltage to drop when a load is interposed between it and the collector supply voltage. As the current through the transistor increases, the voltage drop across the load increases and the collector voltage is commensurably reduced. At sufficiently high current, the collector voltage can drop to the point where the collector base junction, as well as the emitter base junction, becomes forward biased. This is known as the saturated on condition; in this state a large number of minority carriers can be stored in the collector region. When the collector region is relatively thick and lightly doped, as is required in order for the transistor to exhibit a high breakdown voltage, the volume for charge storage is substantial. This stored charge must be removed before the transistor can be returned to its off condition. The time required to substantially remove the excess minority carrier stored charge is called the storage time. While this time can be substantially reduced by increasing the amount of turn-off drive to the base of the transistor, low storage time without increased turn-off drive can be achieved if the lifetime of the excess minority carriers in the collector region is made very small. On the other hand the lifetime in the base region adjacent to the collector and in the vicinity of the emitter base junction must be maintained relatively high in order that the transistor has high current gain, i.e., that it not require excessively large on drives in order to reach the saturation condition.

Also in order for the transistor to have fast transitions between the off and on states, the base width itself must be relatively narrow so that the transistor has good frequency response. Thus transistor structures adapted to have switching times in the order of tens of nanoseconds will have base widths on the order of 1 micron. That is the base penetration will typically be on the order of 1 to 4 microns beneath the major surface of the semiconductor body, and the emitter penetration will ordinarily be 40 to 80 percent of the base penetration. These emitters and bases are typically achieved by masked diffusions from a major surface of a semiconductor body.

As stated above, the known way of achieving a low minority carrier lifetime in the collector region is to introduce lifetime killing impurities into the semiconductor body at a relatively high temperature. In addition to the fact that the high temperature often causes undesirable movement of the collector base and emitter base junctions, control of the lifetime by such introduction is difficult. That is, the lifetime reduction appears to be quite sensitive to crystalline impurifications majority doping density, geometry, and the rate at which the semiconductor body is cooled following the final high temperature step. Because the lifetime killing impurity often tends to concentrate near the surface lifetime in the base region and at the emitter base junction may be reduced undesirably from the standpoint of maintaining the current gain.

Ion implantation of dopant atoms to control majority carrier concentrations in semiconductor bodies is well known. Charge dopant species are accelerated and introduced into the semiconductor crystal where they are stopped by the host lattice atoms. The peak density of the implanted species ordinarily lies somewhat beneath the surface of the semiconductor body. Typical dopant ions, such as boron, phosphorous, and arsenic, typically have concentration peaks less than 1 micron beneath a silicon surface for ion energies less than 100 keV. The stopping of such energetic ions by the semiconductor lattice results in damage, i.e., vacancies and interstitials are produced in a single crystal host lattice. Such damage acts as recombination centers which undesirably reduces the lifetime in the silicon crystal. This lifetime may be recovered by annealing the ion implantation damage at temperatures in the range of 600° to a 1000° C.

Of course ions other than the normal conductivity determining elements may be implanted into the semiconductor. For example, hydrogen ions (protons) at an energy of 200 keV have a projected range of 2–3 microns is silicon while protons of 600 keV energy have a projected range of about 8 microns. Since hydrogen has an extremely high diffusion coefficient in silicon, annealing the silicon at its temperature of 500° C can cause most of the hydrogen atoms to out diffuse. On the other hand, the vacancies and interstitials introduced into the silicon lattice by the stopping of the protons will be relatively unaffected by such low temperature annealing. Thus recombination centers whose number increases with the total number of implanted protons will be introduced into the subsurface location in the silicon semiconductor. If such proton bombardment is carried out after the normal high temperature steps attendant to the introduction of base and emitter impurities into the semiconductor substrate, low temperature annealing to remove the hydrogen atoms thus introduced will have little effect on the distribution of the dopant impurities used to form the emitter and base regions. Thus the lifetime killing engendered by proton bombardment can be localized so that the lifetime is minimum in the lightly doped collector region where most of the stored charge resides when the transistor is in the on condition. Such proton implantation will be relatively unaffected by the presence of the normal masking oxide used to define the lateral geometries of the emitter and base regions. That is, the projected range of hydrogen in $SiO_2$ is similar to that in silicon, so that masking oxides of 1 micron or less in thickness will not significantly affect the penetration into the silicon of high energy protons.

In some cases it may be desirable to control the lifetime reduction selectively across the area of a device or aggregation of devices. For example, in an integrated circuit, it may be desirable to have some transistors with very low storage times, while on the other hand keeping storage time of other transistors or diodes at relatively high values. Such selective lifetime reduction may be accomplished by using thin maskant of relatively high atomic weight. For example the projected range of 200 keV protons in gold is less than 1 micron. A 1 micron gold layer is easily applied to the surface of a semiconductor substrate by evaporation and can be patterned by conventional photolithographic techniques. In areas where the gold is not removed there will be virtually no introduction of protons into the semiconductor substrate. Thus lifetime can be reduced selectively in the subsurface region of the device by using a high energy implantation of a light species, and can be reduced selectively across the area of a device for integrated circuit by appropriate masking of material with relatively high atomic weight.

The following example will serve to more particularly describe the method of the invention and to indicate the characteristics of the transistor devices produced thereby. Two groups of npn transistors made by the method suggested by Kleimack supra were prepared. Approximately 10 microns of lightly doped n-type material was grown on a heavily doped n-type semiconductor substrate. Oxide thermally grown on the surface of the epitaxial wafer was patterned to provide apertures for the desired base regions. Boron impurities were introduced to a depth of approximately 3 microns to provide the base region of the transistor. Following another oxidation step, apertures were formed within the base regions to delineate the desired emitter areas and phosphorous impurities were introduced to a depth of approximately 2 microns from the surface of the silicon wafer. At this point apertures were cut in both the base and emitter regions to allow contacts thereto. Gold was evaporated to the face of the silicon substrate wafer opposite the base and emitter regions, and the gold was diffused into the silicon wafer at a temperature of 920° C for 30 minutes. This diffusion step was followed by a rapid quench to avoid precipitation of the gold introduced by the diffusion step. The other half of the wafers had a 150 keV proton implantation at a dose of $10^{13}$ atoms per square centimeter. Following the implantation, the current gain was found to have been reduced to a value of about 10 as compared with the preimplantation value of about 100. The current gain was substantially recovered by a 5 minute, 600° C anneal in a nitrogen ambient. Both groups of wafers were metallized to allow contacting of the emitter base and collector regions. Saturation times of about 200 nanoseconds were measured for the gold diffused parts whereas the ion implanted parts had saturation times of about 40 nanoseconds. Collector leakage currents for both groups were similar. Thus for similar basewidths and current gains the ion implant devices were marketably superior in terms of their switching speed as measured by saturation times.

What is claimed is:

1. A method for increasing the switching speed of a semiconductor device comprising the step of selectively reducing minority carrier lifetime by high energy proton implantation.

2. The method of claim 1 where the semiconductor device is a transistor and the lifetime is selectively reduced in the collector region of the transistor.

3. The method of claim 2 where the energy of the proton implantation is 150 keV or greater.

4. A method for controlling the relative switching speeds of active devices on a common semiconductor substrate comprising the steps of reducing minority carrier lifetime in preselected active regions by high energy proton implantation.

5. The method of claim 4 where the protons have an energy of 150 keV or greater.

6. The method of claim 4 where said preselected active regions are determined by masking other regions with a maskant having a lower projected range for said implanted species than said preselected active regions.

* * * * *